US012787190B2

(12) United States Patent
Chen

(10) Patent No.: US 12,787,190 B2
(45) Date of Patent: Nov. 3, 2026

(54) MODULE SNAP DEVICE AND MODULE

(71) Applicant: VERTIV CORPORATION, Westerville, OH (US)

(72) Inventor: Junjie Chen, Shenzhen (CN)

(73) Assignee: VERTIV CORPORATION, Westerville, OH (US)

( * ) Notice: Subject to any disclaimer, the term of this patent is extended or adjusted under 35 U.S.C. 154(b) by 0 days.

(21) Appl. No.: 19/214,640

(22) Filed: May 21, 2025

(65) Prior Publication Data

US 2026/0143606 A1 May 21, 2026

(30) Foreign Application Priority Data

Nov. 19, 2024 (CN) ......................... 202422822993.2

(51) Int. Cl.
*A45F 5/10* (2006.01)
*B25G 1/04* (2006.01)
*H05K 5/02* (2006.01)

(52) U.S. Cl.
CPC ............... *H05K 5/023* (2013.01); *B25G 1/04* (2013.01)

(58) Field of Classification Search
CPC ........ H05K 7/1409; H05K 7/16; H05K 5/023; H05K 5/0217; H05K 5/0221; H05K 5/0226; H05K 5/0295; B25G 1/04; B25G 3/38; B25G 3/18; G05F 1/187; G05F 1/184; G05F 1/181; G05F 1/185; G05F 1/186
USPC .......... 16/429, 412, 415, 438, 439, 444, 445
See application file for complete search history.

(56) References Cited

U.S. PATENT DOCUMENTS 6,222,736 B1 * 4/2001 Sim ......................... G06F 1/184 361/732
6,374,460 B1 * 4/2002 Edevold ............... H05K 5/0221 294/169
6,490,153 B1 * 12/2002 Casebolt ................ G06F 1/184 361/679.33
6,560,114 B2 * 5/2003 Berry .................. H05K 7/1489 361/740

(Continued)

*Primary Examiner* — Chuck Y Mah
(74) *Attorney, Agent, or Firm* — Harness, Dickey & Pierce, P.L.C.

(57) ABSTRACT

The present disclosure relates to a module snap device and a module. The module snap device includes a snap spring strip and a handle. An end of the snap spring strip is fixed in a mounting groove extending from the interior of a mounting side of the module to a module panel, another end of the snap spring strip extends from the mounting groove to the front of the module panel, the snap spring strip is provided with at least one snap block protruding from a mounting hole opened on the mounting side of the module and penetrating to the mounting groove; and the another end of the snap spring strip, when pressed, drives the at least one snap block to retract from the mounting hole. The handle includes a pull rod and two rotating arms rotatably connected to the module on respective sides of the snap spring strip; a boss is provided on a side of the pull rod away from the two rotating arms; the snap spring strip is locked when the two rotating arms are rotated relative to the module to rotate the pull rod until the boss on the pull rod abuts against the snap spring strip. With the module snap device, a module can be fixed in an apparatus securely and reliably, without occupying additional space in the apparatus.

10 Claims, 3 Drawing Sheets

(56) References Cited

U.S. PATENT DOCUMENTS

| | | | | |
|---|---|---|---|---|
| 7,400,936 | B2 * | 7/2008 | Chang | G06F 1/184 |
| 8,976,536 | B2 * | 3/2015 | French, Jr. | H05K 7/1427 361/755 |
| 9,801,296 | B1 * | 10/2017 | Wu | E05B 65/00 |
| 10,485,123 | B1 * | 11/2019 | Lin | H05K 5/0221 |
| 12,144,138 | B2 * | 11/2024 | Hung | H05K 7/16 |
| 12,648,106 | B1 * | 6/2026 | Torabi | H05K 7/1489 |
| 2005/0264382 | A1 * | 12/2005 | McMiller | H04N 21/426 348/E5.097 |
| 2015/0327378 | A1 * | 11/2015 | Mao | G06F 1/182 220/757 |
| 2019/0107869 | A1 * | 4/2019 | Hung | G06F 1/187 |
| 2022/0248546 | A1 * | 8/2022 | Di Dihuweii | G06F 1/181 |
| 2024/0138092 | A1 * | 4/2024 | Lin | G11B 33/124 |
| 2024/0389250 | A1 * | 11/2024 | Zhao | H05K 7/18 |
| 2025/0287520 | A1 * | 9/2025 | Tsorng | H05K 7/1409 |
| 2026/0013068 | A1 * | 1/2026 | Khadgi | G11B 33/128 |

* cited by examiner

MODULE SNAP DEVICE AND MODULE

CROSS-REFERENCE TO RELATED APPLICATION

This application claims priority to Chinese Patent Application No. 202422822993.2, titled "MODULE SNAP DEVICE AND MODULE", filed on Nov. 19, 2024 with the China National Intellectual Property Administration, the entire disclosure of which is incorporated herein by reference.

FIELD

The present disclosure relates to a module fixing structure in an apparatus, and more particularly to a module snap device and a module.

BACKGROUND

With the development of communication technology, performance of a communication apparatus becomes highly required. In addition to high requirements on data processing capability or power density, there are also high requirements on security and reliability of the communication apparatus. Especially for a modular integrated communication apparatus, a large number of modules are integrated in a limited cabinet. Hence, installation and fixation of the modules is required to reduce the space occupied by module fixation as much as possible to increase an overall capacity of the apparatus, and realize safe and reliable fixation. A conventional module fixing method is to fix the upper and lower sides or the left and right sides of the module to the apparatus by screws, which requires a large space in the apparatus.

SUMMARY

A technical problem to be solved by the present disclosure is to provide a module snap device and a module, with which a module can be fixed in an apparatus safely and reliably without occupying additional apparatus space, so as to solve the above-mentioned defects of the conventional technology.

In order to solve the technical problem, a module snap device is provided in a first aspect of the present disclosure. The module snap device is for fixing a module, and includes a snap spring strip and a rotatable handle. An end of the snap spring strip is fixed in a mounting groove extending from the interior of a mounting side of the module to a module panel, another end of the snap spring strip extends from the mounting groove to the front of the module panel, the snap spring strip is provided with at least one snap block protruding from a mounting hole opened on the mounting side of the module and penetrating to the mounting groove, and the another end of the snap spring strip, when pressed, drives the at least one snap block to retract from the mounting hole. The rotatable handle includes a pull rod and two rotating arms connected to ends of the pull rod; ends of the two rotating arms away from the pull rod are rotatably connected to the module on respective sides of the snap spring strip; a boss is provided on a side of the pull rod away from the two rotating arms at a position corresponding to the snap spring strip; and the snap spring strip is locked when the two rotating arms are rotated relative to the module to rotate the pull rod until the boss on the pull rod abuts against the snap spring strip.

According to an embodiment of the module snap device in the first aspect of the present disclosure, the snap spring strip includes a first snap cantilever, a bent connecting arm and a second snap cantilever. An end of the first snap cantilever is riveted and fixed in the mounting groove, and another end of the first snap cantilever extends out of the module panel from the mounting groove and is connected to an end of the bent connecting arm, and another end of the bent connecting arm is bent relative to the first snap cantilever toward the interior of the module and extends to be connected to an end of the second snap cantilever.

According to an embodiment of the module snap device in the first aspect of the present disclosure, two snap blocks are arranged side by side on the first snap cantilever and protrude from two mounting holes opened on the mounting side of the module and penetrating to the mounting groove; and the second snap cantilever, when pressed, drives the two snap blocks to retract from the two mounting holes respectively.

According to an embodiment of the module snap device in the first aspect of the present disclosure, a pressing handle is provided at another end of the second snap cantilever.

According to an embodiment of the module snap device in the first aspect of the present disclosure, ends of the two rotating arms away from the pull rod are rotatably connected to respective mounting arms extending from sides of the module to the front of the module panel.

According to an embodiment of the module snap device in the first aspect of the present disclosure, each of the mounting arms includes a first extension arm extending from a side of the module to the front of the module panel, a bent extension arm connected to another end of the first extension arm and bent toward the interior of the module relative to the first extension arm, and a second extension arm connected to another end of the bent extension arm and extending toward the front of the module panel; and the two rotating arms are rotatably connected to second extension arms of the two mounting arms respectively.

According to an embodiment of the module snap device in the first aspect of the present disclosure, the two rotating arms are rotatably connected to the second extension arms of the two mounting arms via press riveting shafts, respectively.

According to an embodiment of the module snap device in the first aspect of the present disclosure, the handle is further provided with a first fastener for locking with the module when the pull rod is rotated until the boss on the pull rod abuts against the snap spring strip.

According to an embodiment of the module snap device in the first aspect of the present disclosure, the first fastener is a captive screw provided on the pull rod at a position away from the boss, and the captive screw is locked with a nut correspondingly arranged on the module panel when the pull rod is rotated until the boss on the pull rod abuts against the snap spring strip.

In order to solve the technical problem, a module is provided in a second aspect of the present disclosure. The module includes a module chassis, a module cover connected to an upper end of the module chassis, and a module panel connected at the front end of the module chassis and the module cover. The module is further provided with the module snap device as described above. One of the module cover, a left side plate of the module chassis, and a right side plate of the module chassis serves as a mounting side to fix the module through the module snap device.

Beneficial effects of the module snap device and the module according to the present disclosure are described below. In the module snap device according to the embodiment of the present disclosure, the module is snapped and fixed to an apparatus through the snap block on the snap spring strip, and the handle is rotatable so that the boss on the handle abuts against the snap spring strip, thereby locking the snap spring strip. In this way, a risk of the module falling out of the apparatus due to the snap block being disengaged from a snap position is avoided. Moreover, operation of fixing the module through the snap device of the module is implemented in the front of the module panel, without occupying additional space of the apparatus, so that the apparatus space is saved. According to a further embodiment of the present disclosure, the module snap device is provided with a first fastener on the handle, and the first fastener further locks the handle that locks the snap spring strip with the module, thereby locking the space where the snap spring strip is pressed and completely fixing the module in the apparatus. In this way, a risk of the module falling out of the apparatus during testing, operation, transportation, and the like, is avoided, and the fixation is safe and reliable.

BRIEF DESCRIPTION OF THE DRAWINGS

The present disclosure is further described below with reference to the accompanying drawings and embodiments. In the drawings.

Figure 1:
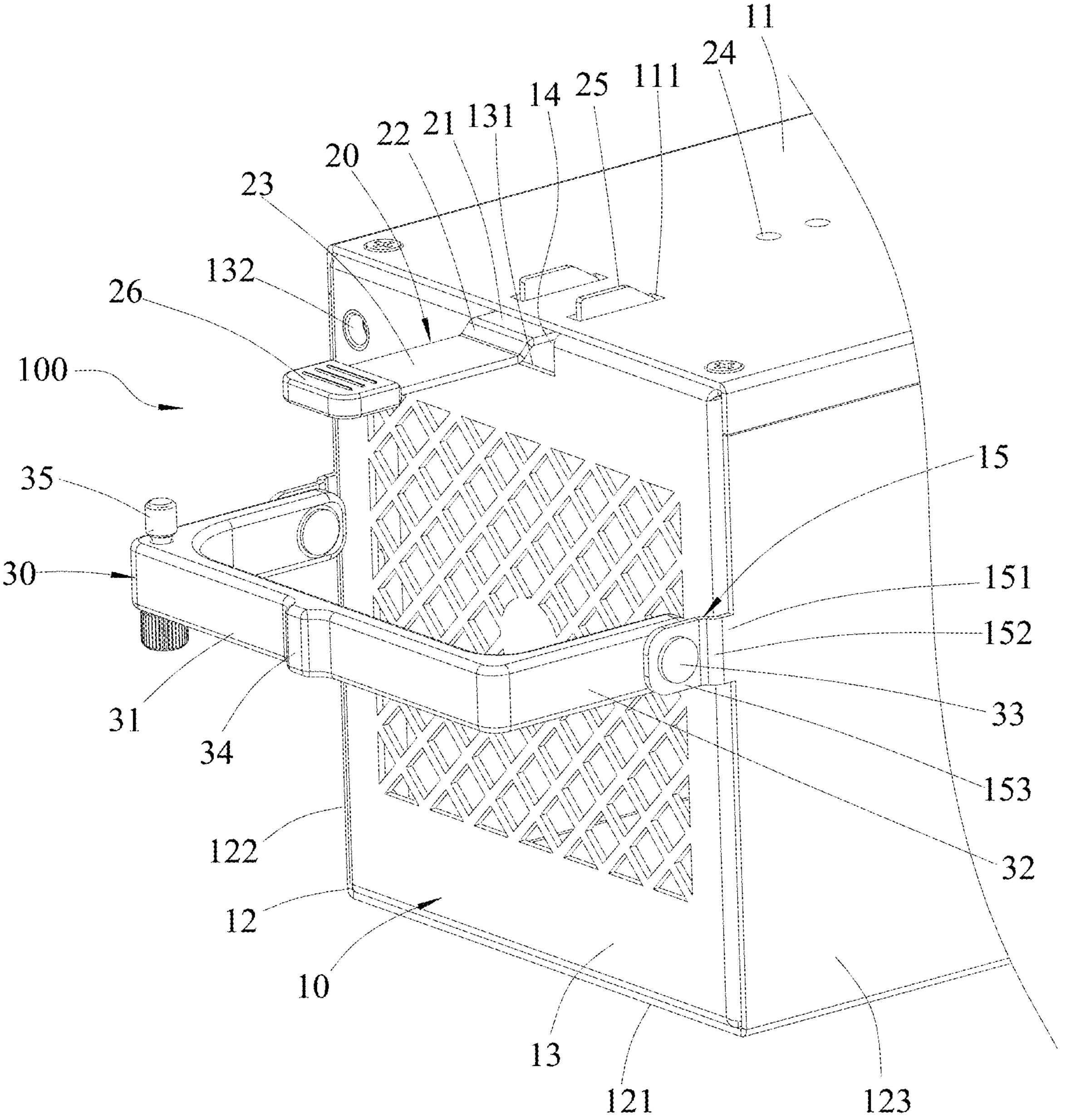
FIG. 1 is a schematic structural diagram of a module snap device in an unlocked state according to an embodiment of the present disclosure.

Reference numerals in the drawings are listed below.

100—Module snap device; 10—Module; 11—Module cover; 111—Mounting hole; 12—Module chassis; 121—Bottom plate; 122—Left side plate; 123—Right side plate; 13—Module panel; 131—Notch; 132—Second fastener; 14—Mounting groove; 15—Mounting arm; 151—First extension arm; 152—Bent extension arm; 153—Second extension arm; 20—Snap spring strip; 21—First snap cantilever; 22—Bent connecting arm; 23—Second snap cantilever; 24—Rivet; 25—Snap block; 26—Pressing operation handle; 30—Handle; 31—Pull rod; 32—Rotating arm; 33—Press riveting shaft; 34—Boss; 35—First fastener.

DETAILED DESCRIPTION

To make the objectives, technical solutions, and advantages of the present disclosure clearer, the present disclosure is further described in detail below in conjunction with the drawings and the embodiments. It should be understood that the embodiments described herein are only for explaining the present disclosure, and are not intended to limit the present disclosure. The embodiments and features of the embodiments in the present disclosure may be combined with each other, as long as no conflict is to be caused.

FIG. 1 is a schematic structural diagram of a module snap device 100 in an unlocked state according to an embodiment of the present disclosure. As shown in FIG. 1, the module snap device 100 is for fixing a module 10 in an apparatus (not shown in the figure). The module 10 shown in FIG. 1 has a module cover 11, a module chassis 12 and a module panel 13. The module chassis 12 is further surrounded by a bottom plate 121 and a left side plate 122 and a right side plate 123 connected to the left and right sides of the bottom plate 121, forming a semi-frame structure. The module cover 11 is connected to upper ends of the left side plate 122 and the right side plate 123 of the module chassis 12, and the module panel 13 is connected at the front end of the module chassis 12 and the module cover 11. In FIG. 1, the module 10 is fixed to the apparatus through the module snap device 100 by using the bottom plate 121 of the module chassis 12 as a fixed baseplate and the module cover 11 as a mounting side.

As shown in FIG. 1, the module snap device 100 is mainly formed by a snap spring strip 20 and a handle 30. The snap spring strip 20 is configured to snap-in and fix the module 10 to the apparatus, and the handle 30 is configured to lock the snap spring strip 20 to prevent the module 10 from falling out of the apparatus. An end of the snap spring strip 20 is fixed in a mounting groove 14 extending from the interior of the module cover 11 to the module panel 13, and another end of the snap spring strip 20 extends from the mounting groove 14 to the front of the module panel 13, thereby forming a structure capable of generating elastic deformation by pressing the another end that extends out to drive the snap block 25 on the snap spring strip 20 to move downward. The handle 30 is rotatably disposed below the snap spring strip 20. The snap spring strip 20 can be locked when the handle 30 is rotated upward such that the boss 34 on the handle 30 abuts against the snap spring strip, thereby preventing the snap block 25 from being separated from the snap position.

Specifically, referring to FIG. 1, the snap spring strip 20 includes a first snap cantilever 21, a bent connecting arm 22 and a second snap cantilever 23. An end of the first snap cantilever 21 is riveted and fixed to an inner side of the module cover 11 by a rivet 24 in the mounting groove 14, and another end of the first snap cantilever 21 extends out of the module panel 13 from the mounting groove 14 and is connected to an end of the bent connecting arm 22. Another end of the bent connecting arm 22 is bent relative to the first snap cantilever 21 toward the interior of the module and extends to be connected to an end of the second snap cantilever 23. Another end of the second snap cantilever 23 extends toward the front of the module panel 13 and is provided with a pressing operation handle 26. In such design, the snap spring strip 20 is bent at a certain angle toward the interior of the module, avoiding occupying an external space of the module 10. Two snap blocks 25 are arranged side by side on the first snap cantilever 21 in the mounting groove 14. The two snap blocks 25 protrude from two mounting holes 111 opened on the module cover 11 and penetrating to the mounting groove 14, for snapping and fixing with the apparatus. By pressing the pressing operation handle 26 at the end of the second snap cantilever 23, the second snap cantilever 23 drives the first snap cantilever 21 to produce elastic deformation downward, and thereby drives the two snap blocks 25 to retract from the two mounting holes 111, disengaging from the snap position, so that the snap fixation with the apparatus is released. A notch 131 is formed on an upper end of the module panel 13 at a position facing the mounting groove 14, to provide an escape space for the deformation and displacement of the first snap cantilever 21.

Reference is further made to FIG. 1. The handle 30 includes a pull rod 31 and two rotating arms 32 connected to ends of the pull rod 31. Ends of the two rotating arms 32 away from the pull rod 31 are rotatably connected to the module 10 on respective sides of the snap spring strip 20, allowing the pull rod 31 to face the snap spring strip 20. Referring to FIG. 1, mounting arms 15 are extended from front ends of the left side plate 122 and the right side plate 123 on sides of the module 10, respectively; and the two rotating arms 32 of the handle 30 are rotatably connected to the two mounting arms 15, respectively. Further, each of the mounting arms 15 includes a first extension arm 151 extending from a left side plate 122 or right side plate 123 to the front of the module panel 13, a bent extension arm 152 connected to another end of the first extension arm 151 and bent toward the interior of the module 10 at a certain angle relative to the first extension arm 151, and a second extension arm 153 connected to another end of the bent extension arm 152 and extending toward the front of the module panel 13. The two rotating arms 32 of the handle 30 are rotatably connected to second extension arms 153 of the two mounting arms 15 respectively via, for example, press riveting shafts 33. In such design, the mounting arm 15 is bent at a certain angle toward the interior of the module, avoiding occupying an external space of the module 10.

Figure 2:
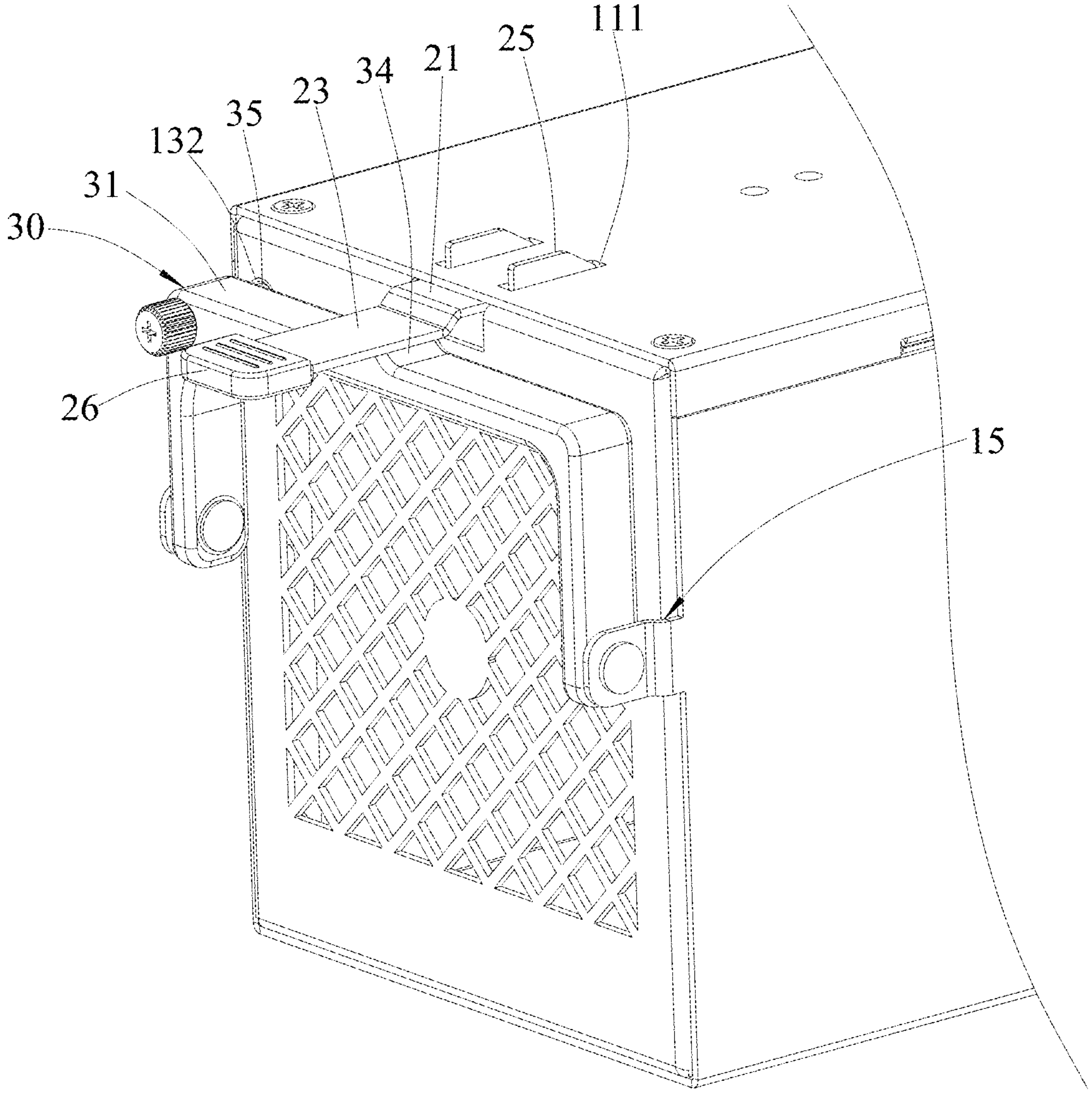
FIG. 2 is a schematic structural diagram of the module snap device as shown in FIG. 1 when in a locked state.
Figure 3:
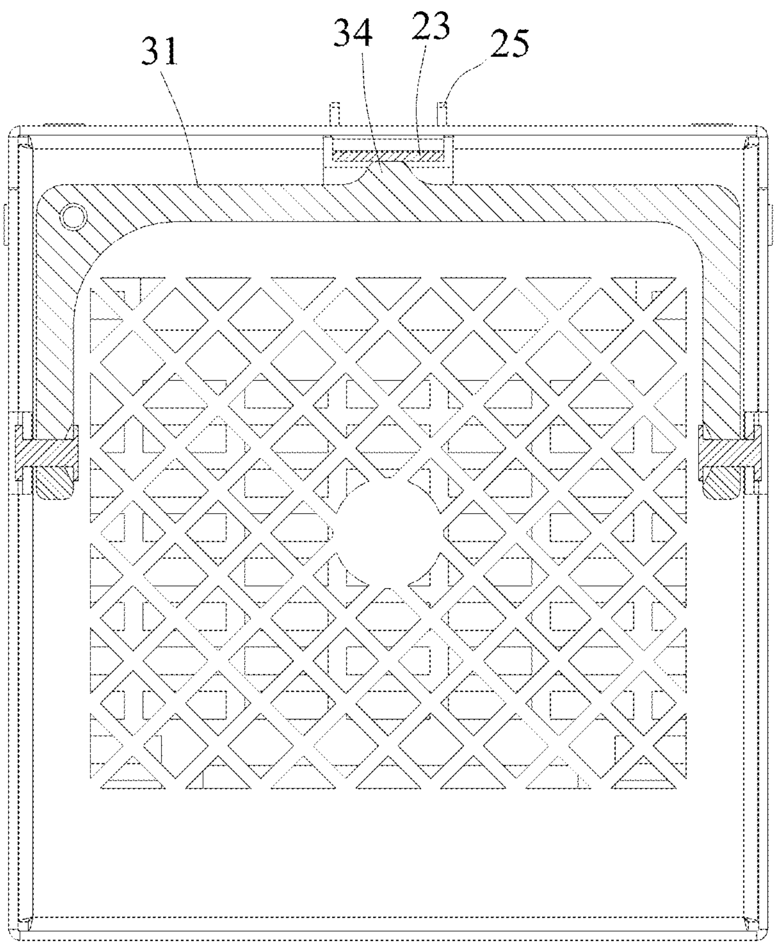
FIG. 3 is a structural cross-sectional view of the module snap device as shown in FIG. 2 when in a locked state.

Referring to FIG. 1 in combination with FIG. 2 and FIG. 3, a boss 34 is provided on the pull rod 31 of the handle 30 at a position corresponding to the snap spring strip 20 on a side away from the two rotating arms 32. When the handle 30 is rotated, through the two rotating arms 32, upward by 90 degrees relative to the module 10 and is in a vertical state, the boss 34 on the pull rod 31 abuts against the second snap cantilever 23 of the snap spring strip 20, supporting the second snap cantilever 23, so that the snap spring strip 20 is locked and the snap blocks 25 on the snap spring strip 20 are prevented from falling out of the snap position. Furthermore, a first fastener 35 may be provided on the handle 30, and a second fastener 132 cooperating with the first fastener 35 may be provided on the module panel 13. When the pull rod 31 of the handle 30 is rotated until the boss 34 on the pull rod 31 abuts against the second snap cantilever 23, the handle 30 may be locked relative to the module 10 through cooperation of the first fastener 35 and the second fastener 132. In this way, the space where the snap spring strip 20 is pressed is locked, and the module 10 is completely fixed in the apparatus, so that the risk of the module 10 falling out of the apparatus during testing, operation, transportation, and the like, is avoided. In the embodiment shown in the figure, the first fastener 35 is a captive screw arranged on the pull rod 31 at a position away from the boss 34, and the second fastener 132 is a nut fixed by press riveting to a corresponding position on the module panel 13. When the pull rod 31 is rotated until the boss 34 abuts against the second snap cantilever 23, the captive screw is locked with the nut on the module panel 13, so that the handle 30 is locked relative to the module 10 and cannot rotate, and thereby the snap spring strip 20 is locked.

A specific operation of fixing the module 10 with the module snap device 100 according to the above embodiment of the present disclosure includes the following steps.

In a first step, the module 10 mounted with the module snap device 100 is placed into an apparatus, as shown in FIG. 1, and the module 10 is snapped and fixed to an apparatus through two snap blocks 25 protruding out of the module cover 11.

In a second step, the handle 30 is rotated upward by 90 degrees to a vertical state, so that the boss 34 on the pull rod 31 abuts against the bottom of the second snap cantilever 23 of the snap spring strip 20, as shown in FIG. 2 and FIG. 3.

In a third step, the first fastener 35 on the handle 30 is locked with the second fastener 132 on the module panel 13, as shown in FIG. 2 and FIG. 3, to fix the position of the handle 30, so that the snap spring strip 20 is locked and the module 10 is completely fixed in the apparatus.

In a fourth step, when the module 10 needs to be pulled out of the apparatus, the first fastener 35 and the second fastener 132 are released, and the handle 30 is rotated downward to drive the boss 34 on the handle 30 away from the second snap cantilever 23 of the snap spring strip 20.

In a fifth step, the pressing operation handle 26 of the snap spring strip 20 is pressed, so that the snap block 25 moves downward and retracts with the elastic deformation of the snap spring strip 20 and leaves the snap position, so that the module 10 can be pulled out of the apparatus through the handle 30.

According to the above embodiment of the present disclosure, the module 10 is fixed in the apparatus by using the module cover 11 as the mounting side. The present disclosure is not limited thereto. According to different embodiments of the present disclosure, the left side plate 122 or the right side plate 123 of the module chassis 12 may be flexibly selected as the mounting side to fix the module 10 to the apparatus based on an actual need in application. In this case, the snap spring strip 20 may be arranged on the left or right side of the module 10, the two rotating arms 32 of the handle 30 are rotatably connected to the upper and lower sides of the module 10, and the snap spring strip 20 is locked or unlocked by rotating the handle 30 left and right. Hence, fixing requirements in different directions can be satisfied.

The above are only preferred embodiments of the present disclosure and are not intended to limit the present disclosure. Any modifications, equivalent substitutions and improvements made within the spirit and principles of the present disclosure should be included in the protection scope of the present disclosure.

What is claimed is:

1. A module snap device (100), for fixing a module (10), wherein the module snap device (100) comprises:

a snap spring strip (20), one end of which is fixed in a mounting groove (14) extending from interior of a mounting side of the module (10) to a module panel (13), and the other end of which extends from the mounting groove (14) to the front of the module panel (13), wherein the snap spring strip (20) is provided with at least one snap block (25) protruding from a mounting hole (111) opened on the mounting side of the module (10) and penetrating to the mounting groove (14); and the other end of the snap spring strip (20), when pressed, drives the at least one snap block (25) to retract from the mounting hole (111); and a handle (30) comprising a pull rod (31) and two rotating arms (32) connected to both ends of the pull rod (31), wherein ends of the two rotating arms (32) away from the pull rod (31) are rotatably connected to the module (10) on respective sides of the snap spring strip (20), a boss (34) is provided on a side of the pull rod (31) away from the two rotating arms (32) at a position corresponding to the snap spring strip (20) and the snap spring strip (20) is locked when the two rotating arms (32) are rotated relative to the module (10) to rotate the pull rod (31) until the boss (34) on the pull rod (31) abuts against the snap spring strip (20).

2. The module snap device (100) according to claim 1, wherein the snap spring strip (20) comprises a first snap cantilever (21), a bent connecting arm (22) and a second snap cantilever (23), one end of the first snap cantilever (21) is press riveted and fixed in the mounting groove (14), and the other end of the first snap cantilever (21) extends out of the module panel (13) from the mounting groove (14) and is connected to one end of the bent connecting arm (22), and the other end of the bent connecting arm (22) is bent relative to the first snap cantilever (21) toward the interior of the module (10) and extends to be connected to one end of the second snap cantilever (23).

3. The module snap device (100) according to claim 2, wherein the at least one snap block comprises two snap blocks, and said two snap blocks (25) are arranged side by side on the first snap cantilever (21) and protrude from two mounting holes (111) opened on the mounting side of the module (10) and penetrating to the mounting groove (14), and the second snap cantilever (23), when pressed, drives the two snap blocks (25) to retract from the two mounting holes (111) respectively.

4. The module snap device (100) according to claim 3, wherein a pressing operation handle (26) is provided at the other end of the second snap cantilever (23).

5. The module snap device (100) according to claim 1, wherein ends of the two rotating arms (32) away from the pull rod (31) are rotatably connected to two mounting arms (15) extending from sides of the module (10) to the front of the module panel (13), respectively.

6. The module snap device (100) according to claim 5, wherein each of the two mounting arms (15) comprises a first extension arm (151) extending from a side of the module (10) to the front of the module panel (13), a bent extension arm (152) connected to the other end of the first extension arm (151) and bent toward the interior of the module (10) relative to the first extension arm (151), and a second extension arm (153) connected to the other end of the bent extension arm (152) and extending toward the front of the module panel (13); the two rotating arms (32) are rotatably connected to second extension arms (153) of the two mounting arms (15) respectively.

7. The module snap device (100) according to claim 6, wherein the two rotating arms (32) are rotatably connected to the second extension arms (153) of the two mounting arms (15) via press riveting shafts (33), respectively.

8. The module snap device (100) according to claim 1, wherein the handle (30) is further provided with a first fastener (35) for cooperating and locking with the module (10) when the pull rod (31) is rotated until the boss (34) on the pull rod (31) abuts against the snap spring strip (20).

9. The module snap device (100) according to claim 8, wherein the first fastener (35) is a captive screw provided on the pull rod (31) at a position away from the boss (34), and the captive screw is locked with a nut correspondingly arranged on the module panel (13) when the pull rod (31) is rotated until the boss (34) on the pull rod (31) abuts against the snap spring strip (20).

10. A module (10), comprising a module chassis (12), a module cover (11) connected to an upper end of the module chassis (12), and a module panel (13) connected at the front end of the module chassis (12) and the module cover (11), wherein the module (10) is further provided with a module snap device (100), and one of the module cover (11), a left side plate (122) of the module chassis (12), and a right side plate (123) of the module chassis (12) serves as a mounting side to fix the module (10) through the module snap device (100), wherein the module snap device (100) comprises:

a snap spring strip (20), one end of which is fixed in a mounting groove (14) extending from interior of the mounting side of the module (10) to the module panel (13), and the other end of which extends from the mounting groove (14) to the front of the module panel (13), wherein the snap spring strip (20) is provided with at least one snap block (25) protruding from a mounting hole (111) opened on the mounting side of the module (10) and penetrating to the mounting groove (14); and the other end of the snap spring strip (20), when pressed, drives the at least one snap block (25) to retract from the mounting hole (111); and a handle (30) comprising a pull rod (31) and two rotating arms (32) connected to both ends of the pull rod (31), wherein ends of the two rotating arms (32) away from the pull rod (31) are rotatably connected to the module (10) on respective sides of the snap spring strip (20), a boss (34) is provided on a side of the pull rod (31) away from the two rotating arms (32) at a position corresponding to the snap spring strip (20) and the snap spring strip (20) is locked when the two rotating arms (32) are rotated relative to the module (10) to rotate the pull rod (31) until the boss (34) on the pull rod (31) abuts against the snap spring strip (20).

* * * * *